(12) United States Patent
Yoshinaga et al.

(10) Patent No.: US 8,217,424 B2
(45) Date of Patent: Jul. 10, 2012

(54) SEMICONDUCTOR DEVICE HAVING STACKED INGAP AND GAAS LAYERS, AND METHOD OF MAKING SAME

(75) Inventors: Yasuyuki Yoshinaga, Kanagawa (JP); Yasunori Bito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 282 days.

(21) Appl. No.: 12/549,023

(22) Filed: Aug. 27, 2009

(65) Prior Publication Data

US 2010/0052013 A1    Mar. 4, 2010

(30) Foreign Application Priority Data

Aug. 27, 2008  (JP) ................. 2008-218849

(51) Int. Cl.
*H01L 29/778*  (2006.01)
(52) U.S. Cl. .......... 257/194; 257/192
(58) Field of Classification Search .......... 257/76, 257/183, 194, 199, 324, 471, E29.089; 438/369
See application file for complete search history.

(56) References Cited

U.S. PATENT DOCUMENTS

| | | | | |
|---|---|---|---|---|
| 5,367,183 A * | 11/1994 | Perea et al. | ............. | 257/194 |
| 2001/0019131 A1 * | 9/2001 | Kato et al. | ............. | 257/76 |
| 2003/0006427 A1 * | 1/2003 | Fukuhara et al. | ............. | 257/197 |
| 2003/0224576 A1 * | 12/2003 | Yamaguchi | ............. | 438/369 |
| 2006/0220165 A1 * | 10/2006 | Hase | ............. | 257/471 |
| 2007/0045663 A1 * | 3/2007 | Bito | ............. | 257/194 |
| 2008/0026545 A1 * | 1/2008 | Cooke et al. | ............. | 438/478 |
| 2008/0251837 A1 * | 10/2008 | Kato et al. | ............. | 257/324 |
| 2008/0257409 A1 * | 10/2008 | Li et al. | ............. | 136/259 |
| 2008/0296622 A1 * | 12/2008 | Kiewra et al. | ............. | 257/194 |

FOREIGN PATENT DOCUMENTS

| | | |
|---|---|---|
| JP | 5-259191 | 10/1993 |
| JP | 6-244218 | 9/1994 |
| JP | 2004-158772 | 6/2004 |
| JP | 2004-179318 | 6/2004 |

OTHER PUBLICATIONS

Ordering-induced electron accumulation at GaInP/GaAs Hetero-interfaces, Journal of Crystal Growth 211 (2000) 515-519.
Electronic Structure of Ordered, Studied by Raman-Scattering and Photoluminescence-Excitation Measurements, Japanese journal of Applied Physics vol. 44, No. 10, 2005, pp. 7390-7394.

* cited by examiner

*Primary Examiner* — N Drew Richards
*Assistant Examiner* — Peter Bradford
(74) *Attorney, Agent, or Firm* — Young & Thompson

(57) ABSTRACT

It is desired for semiconductor devices to reduce leakage currents. In a semiconductor device having a stacked structure including a GaAs layer and an InGaP layer, p-type impurity is doped to the GaAs layer. Consequently, the conduction band of the GaAs is raised to higher than the Fermi level. As a result, electron accumulation is suppressed and the gate leakage current can be reduced.

18 Claims, 10 Drawing Sheets

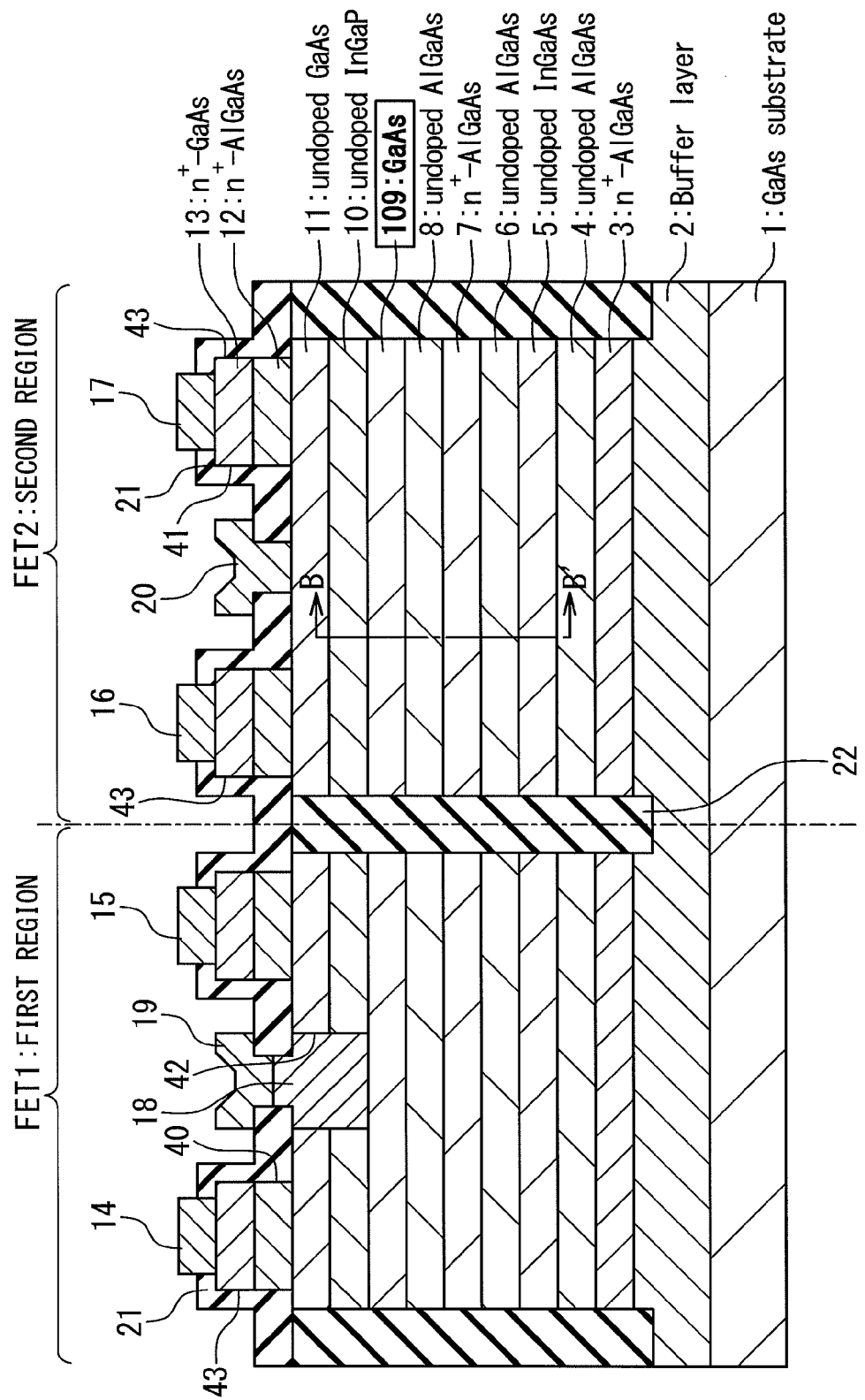

US 8,217,424 B2

SEMICONDUCTOR DEVICE HAVING STACKED INGAP AND GAAS LAYERS, AND METHOD OF MAKING SAME

INCORPORATION BY REFERENCE

This application is related to, Japanese Patent Application No. 2008-218849 filed at 27 Aug., 2008. The disclosure of that application is incorporated herein by reference.

BACKGROUND OF THE INVENTION

1. Field of the Invention

The present invention relates to a semiconductor device having a structure in which an InGaP layer and a GaAs layer are stacked.

2. Description of Related Art

A module on which power amplifier elements and switch elements are mounted has been developed for reducing size and achieving multi-function in an IC for wireless communication of mobile terminal. Enhancement-type FETs are used as power elements due to the requirement of an operation with a single power supply. On the other hand, as switch elements, depletion-type FETs that can easily realize a low on resistance are used. Techniques are implemented in which those two elements are prepared on the same single substrate to form power amplifier elements and switch elements on one chip.

In order to achieve the structure described above, there is a method in which a plurality of etching stopper layers are used to arrange an FET gate at different distances from a channel layer. The InGaP layer serves as a stopper layer against a sulfuric acid etchant for etching GaAs and AlGaAs. Such etching is performed by means of wet etching. The wet etching has an advantage that a crystal suffers less damage compared to the dry etching.

The list below is conventional arts the applicant found:
Patent Document 1: Japanese Laid-Open Patent Application JP-P2004-179318A;
Patent Document 2. Japanese Laid-Open Patent Application JP-P1993-259191A;
Patent Document 3; Japanese Laid-Open Patent Application JP-P1994-244218A;
Patent Document 4; Japanese Laid-Open Patent Application JP-P2004-158772A;
Non-Patent Document 1: T. Tanaka, K. Takano, T. Tsuchiya and H. Sakaguchi, "Ordering-induced electron accumulation at GaInP/GaAs hereto-interfaces", Journal of Crystal Growth, December 2000, Volume 221, p. 515-519; and
Non-Patent Document 2; K. Yamashita, K. Oe, T. Kita, O. Wada, Y. Wang, C. Geng, F. Scholz and H. Schweizer, "Electronic Structure of ordered. Ga0.5In0.5P/GaAs Heterointerface Studied by Raman-Scattering and Photoluminescence-Excitation Measurements", Japanese Journal of Applied Physics, Volume 44., p 7390-7394.

SUMMARY OF THE INVENTION

FIG. 1 shows an example of a structure in which an InGaP stopper layer is used to prepare an enhancement-type FET 1 and a depletion-type FET 2 on the same single substrate.

To a channel layer 5, electrons are supplied from an electron supply layer 3 located below with a spacer layer 4 interposed therebetween, and an AlGaAs layer 7 located above with a spacer layer 6 interposed therebetween. The enhancement-type FET 1 has a p$^+$-GaAs layer 18 doped with highly concentrated C as a p-n junction gate on a GaAs layer 109. A recessed portion whose top surface is the GaAs layer 109 on which the p$^+$-GaAs layer 18 is arranged is formed as follows. First, a GaAs layer 11 is selectively etched using an InGaP layer 10 as a stopper layer. The InGaP layer 10 is subsequently etched to form the recessed portion whose top surface is the GaAs layer 109.

The p-n junction gate is introduced to the enhancement-type FET 1 because it is desired to ensure a large swing width of a gate voltage by increasing a gate forward turn-on voltage. The reason for locating the GaAs layer 109 under the InGaP layer 10 is as follows. If the AlGaAs layer 8 is exposed on a surface, Al becomes easily combined with oxygen so as to oxidize the surface of the AlGaAs layer 8. On such a surface, the p$^+$-GaAs layer 18 cannot epitaxially grow with good quality. Therefore, the GaAs layer 109 that has less oxide is required to be arranged under the InGaP stopper layer 10.

The depletion-type FET 2 has a Schottky gate electrode 20 on the GaAs layer 11. Therefore, the distance between the gate electrode 20 and the channel layer 5 is larger than that in the enhancement-type FET 1. A negative threshold voltage is achieved by this structure. A stacked structure of the InGaP layer 10 and the GaAs layer 109 is thus arranged under the gate electrode 20 of the depletion-type FET 2.

In the structure in which the InGaP layer 10 and the GaAs layer 109 are stacked as exemplified above, the gate leakage current is large. This lowers output power of a power amplifier using the enhance-type FET 1. A switch element using a depletion-type FET 2 suffers from the problems such as an increase of a control current and a small handling power. The leakage current increases because a charge accumulation layer, which acts as a leak path, is formed on the interface between the InGaP layer 10 and the GaAs layer 109.

FIGS. 2A and 2B are energy band diagrams corresponding to a cross section B-B' in FIG. 1 for explaining the mechanism of the formation of the charge accumulation layer on the interface between the InGaP layer and the GaAs layer. FIG. 2A shows a band structure in a case where the InGaP layer is grown under a condition that a natural superlattice is formed (the order type). FIG. 2B shows a band structure in a case where the InGaP layer is grown under a condition that a natural superlattice is not formed (the disorder type).

(A) The case where the InGaP layer is the order type (refer to the non-patent documents 1 and 2)

A polarization charge is generated in the order-type InGaP layer. An electric field is directed from a channel layer to a gate electrode. Therefore, the conduction band of the GaAs layer arranged under the InGaP layer is lowered as shown in FIG. 2A. As a result, the conduction band is lowered below the Fermi level ($E_F$), and thus electrons are accumulated on the interface of InGaP/GaAs. The non-patent document 1 reports a fact that the electron concentration is of the order of $1\times10^{12}$ cm$^{-2}$.

(B) The case where the InGaP layer is the disorder type (refer to the non-patent document 2)

Conduction band discontinuity occurs between the GaAs layer and the InGaP layer. Consequently, the conduction band of GaAs becomes lowered below the Fermi level as shown in FIG. 2B, and thus electrons are accumulated in the GaAs layer.

In each case discussed above, electrons are accumulated between the InGaP layer and the GaAs layer, which causes a gate leakage.

According to an aspect of the present invention, a semiconductor device includes: a channel layer though which a current flows; a gate electrode to control the current; and a two-layer structure in which an InGaP layer and a p-type GaAs layer being doped to be a p-type are contacted which is arranged on a side of the gate electrode to the channel layer.

According to another aspect of the present invention, a manufacturing method of a semiconductor device includes: forming a channel layer; forming a p-type GaAs layer doped to be a p-type; forming an InGaP layer on the p-type GaAs layer; and forming a gate electrode.

Preferably, the forming the gate electrode includes: forming an intermediate layer after a formation of the InGaP layer; selectively etching a predetermined region of the intermediate layer taking the InGaP layer as a stopper layer; forming a recess by etching a predetermined region of the InGaP layer and the p-type GaAs layer; and forming a semiconductor gate electrode at the recess.

Further preferably, the manufacturing method of the semiconductor device further includes: doping p-type carrier in the semiconductor gate electrode. The semiconductor gate electrode is a pn junction gate.

By doping p-type impurity to the GaAs layer, the conduction band of the GaAs is raised to a level higher than the Fermi level. As a result, electron accumulation is suppressed and the gate leakage current can be reduced.

Using the present invention, in a semiconductor device having a structure in which an InGaP layer and a GaAs layer are stacked, a leakage current can be reduced.

BRIEF DESCRIPTION OF THE DRAWINGS

The above and other objects, advantages and features of the present invention will be more apparent from the following description of certain preferred exemplary embodiments taken in conjunction with the accompanying drawings, in which:

FIG. 1 is a cross sectional view of a semiconductor device for explaining a problem related to the present invention;

DESCRIPTION OF THE PREFERRED EMBODIMENTS

Hereinafter, exemplary embodiments of the present invention will be described below with reference to the attached drawings.

Overall Structure of the First Embodiment

Figure 2A:
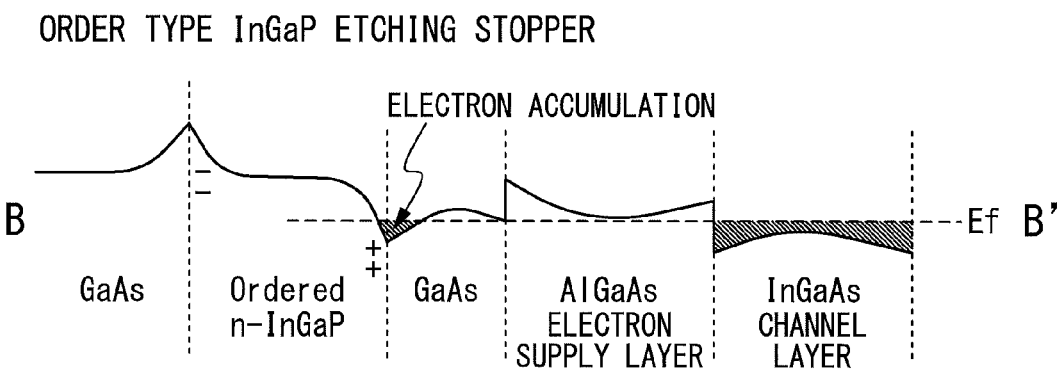
FIG. 2A is an explanatory diagram of a semiconductor device for explaining a problem related to the present invention.
Figure 2B:
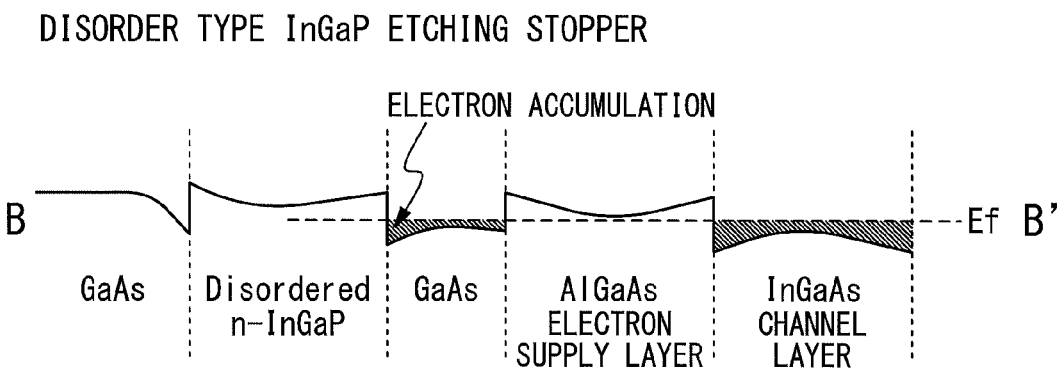
FIG. 2B is an explanatory diagram of the semiconductor device for explaining a problem related to the present invention.
Figure 3A:
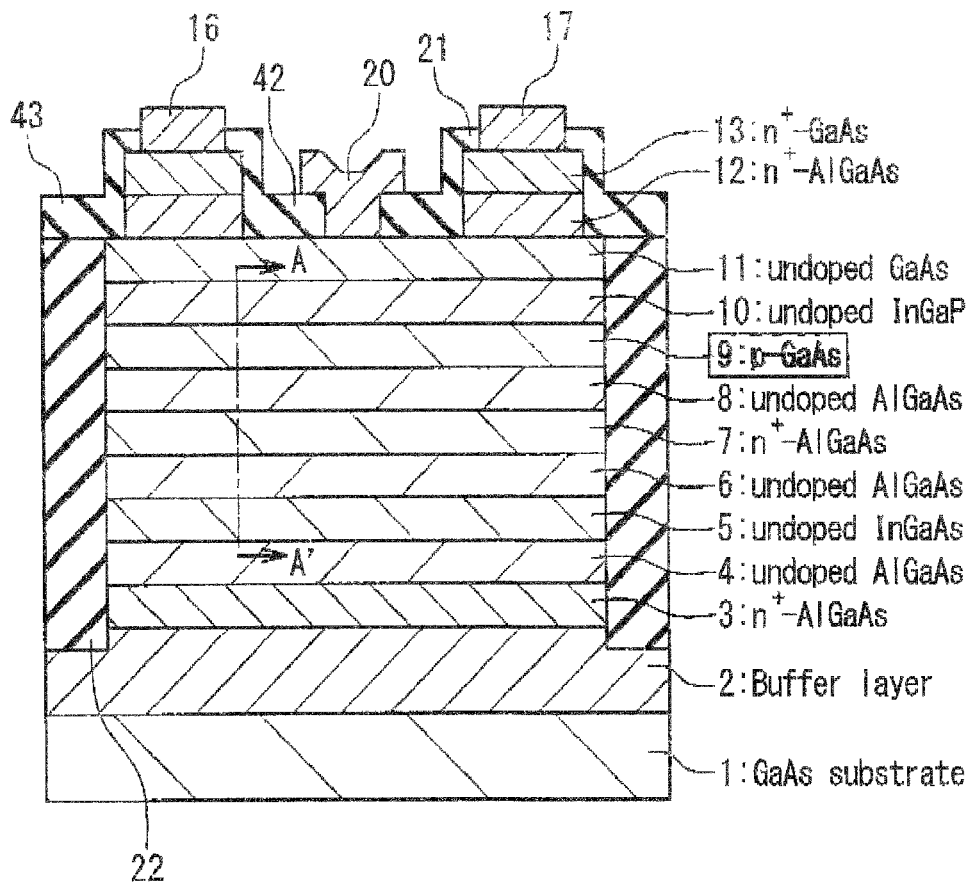
FIG. 3A is a cross sectional view of a semiconductor device according to the first embodiment.

FIG. 3A is a cross sectional view of a semiconductor device according to the first embodiment. The semiconductor device is a depletion-type field effect transistor (FET), which has a negative threshold voltage. The FET constitutes a part of a switch circuit.

The FET is a so-called high electron mobility field effect transistor (HEMT) having an electron supply layer and a channel layer which are made of materials different from each other. The electron supply layer is a layer which supplies electrons. The channel layer is a layer in which the electrons transit. In addition, the present embodiment includes a spacer layer provided between the electron supply layer and the channel layer so as to enhance the mobility of electrons.

As shown in FIG. 3A, the semiconductor device has a stacked structure, which is formed on a semi-insulating GaAs substrate 1 (compound semiconductor substrate), in which III-V group compound semiconductor layers are epitaxially grown in order as follows: a buffer layer (an AlGaAs layer) 2, an electron supply layer (an AlGaAs layer) 3, a spacer layer (an AlGaAs layer) 4, a channel layer (an InGaAs layer) 5, a spacer layer (an AlGaAs layer) 6, an electron supply layer (an AlGaAs layer) 7, an intermediate layer (an AlGaAs layer) 8, an intermediate layer (a GaAs layer) 9, a stopper layer (an InGaP layer) 10, an intermediate layer (an upper compound semiconductor layer) (a GaAs layer) 11, a stopper layer (an AlGaAs layer) 12, and a cap layer (a GaAs layer) 13.

The buffer layer 2 is an undoped AlGaAs layer whose film thickness is 500 nm. The electron supply layer 3 is an n-type AlGaAs layer with a 4 nm film thickness to which $2\times10^{18}$ cm$^{-3}$ of impurity (Si) is doped. The spacer layer 4 is an undoped AlGaAs layer with a 2 nm film thickness. The channel layer 5 is an undoped InGaAs layer with a 15 nm film thickness. The spacer layer 6 is an undoped AlGaAs layer with a 2 nm film thickness. The electron supply layer 7 is an n-type AlGaAs layer with a 10 nm film thickness to which $2\times10^{18}$ cm$^{-3}$ of impurity (Si) is doped. The intermediate layer 8 is an undoped n-type AlGaAs layer with a 5 nm film thickness.

The intermediate layer 9 is a GaAs layer with a 5 nm film thickness formed as a p-type semiconductor by doping a p-type impurity. The effect of the doping of the p-type impurity will be described later.

The stopper layer 10 is an undoped InGaP layer with a 5 nm film thickness. The intermediate layer 11 is an undoped GaAs layer with a 15 nm film thickness. The stopper layer 12 is an n-type AlGaAs layer with a 5 nm film thickness to which $4\times10^{18}$ cm$^{-3}$ of impurity (Si) is doped. The cap layer 13 is an n-type GaAs layer with a 100 nm film thickness to which $4\times10^{18}$ cm$^{-3}$ of impurity (Si) is doped.

The above mentioned compound semiconductor layers 2 to 13 are subsequently stacked on the GaAs substrate 1 by utilizing common techniques for forming a thin film (for example, Metal Organic Chemical Vapor deposition (MOCVD)). Thus, a stacked body including the stacked compound semiconductor layers 2 to 13 is formed on the GaAs substrate 1.

As shown in FIG. 3A, the FET has a source electrode 16 and a drain electrode 17. The source electrode 16 and the drain electrode 17 are Ni—AuGe—Au alloy layers, and are formed on the cap layer 13. The source electrode 16 and the drain electrode 17 of the FET are formed after forming a surface protection layer 21.

A first recess 42 is formed by etching. The recess 42 is formed at a portion between regions where the source electrode 16 and the drain electrode 17 are to be formed. The first recess 42 is a groove formed by partly removing the cap layer 13 and the stopper layer 12. The stopper layer 12 serves as an etching stopper layer for the first recess 42.

A gate electrode 20 of the FET is formed on the intermediate layer 11. The gate electrode 20 is made of WSi. The gate electrode 20 comes into Schottky contact with the intermediate layer 11. Namely, the gate electrode 20 is a Schottky electrode. A Schottky barrier is formed between the gate electrode 20 and the intermediate layer 11. A voltage applied to the gate electrode 20 controls the thickness of the depletion layer of the Schottky junction to carry out an on/off control of the FET.

Each of a plurality of FETs on the substrate is electrically isolated from one another by an isolation region 22. The isolation region 22 is formed by the ion implantation of an impurity (boron (B)) into a bottom of a recess 43 formed by removing the stopper layer 12 and the cap layer 13, etc.

Further, a surface protection film (a passivation film) 21 is formed on a top surface of the stacked body including the compound semiconductor layers 2 to 13. The surface protection film 21 is a $SiO_2$ film, which is formed by common techniques for forming a thin film (such as a chemical vapor deposition). Also, as is obvious from FIG. 3A, each electrode of the FET is formed by removing a part of the surface protection film 21.

In the present embodiment, the gate electrode 20 of the FET is connected to the intermediate layer 11. Thereby, the potential barrier ($\phi_D$) at a gate of the FET 2 becomes 0.8 eV that is generated by the Schottky junction between the gate electrode 20 and the intermediate layer 11. The property of FET 1 thus becomes suitable for the FET for a switch circuit.

[Explanation Regarding the InGaP Layer and the GaAs Layer in the First Embodiment]

Figure 3B:
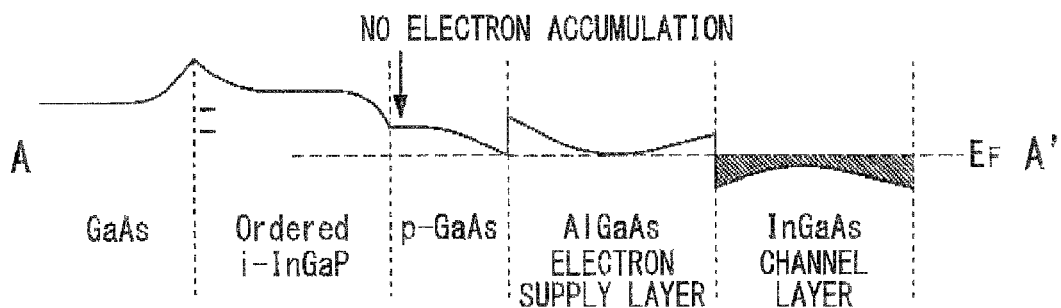
FIG. 3B is an explanatory diagram of a semiconductor device according to the first embodiment.

The effects in the present embodiment obtained by doping the intermediate layer 9 with a p-type impurity will be described below using an energy band diagram in FIG. 3B. In the present embodiment, the p-type impurity is doped to make the underlying GaAs layer 9 as a p-type semiconductor. As a result, the conduction band is raised higher than the Fermi level to suppress the electron accumulation, thereby reducing a gate leakage current. In the present embodiment, when the doping concentration is $1 \times 10^{18}$ $cm^{-3}$, in both of the enhancement-type FET and the depletion-type FET, a gate leakage current can be suppressed to approximately one-tenth in a case where the gate voltage is −3V to −5V.

Second Embodiment

Figure 4:
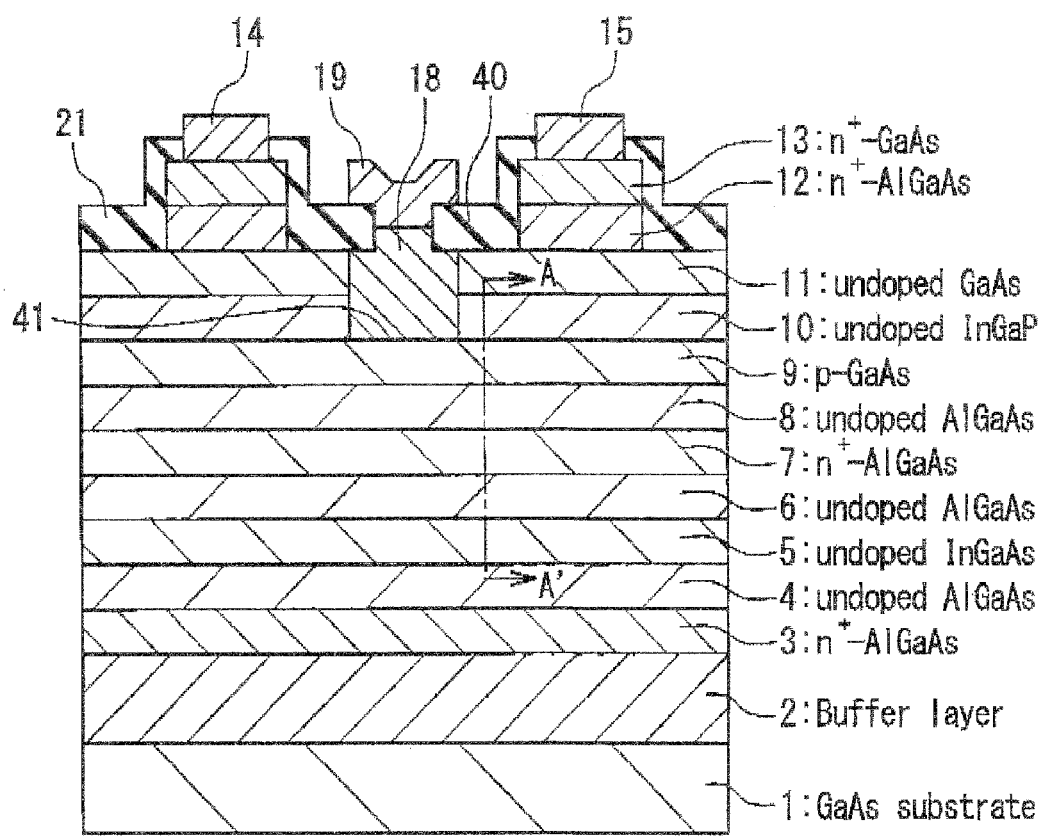
FIG. 4 is a cross sectional view of a semiconductor device according to the second embodiment.

FIG. 4 is a cross sectional view of a semiconductor device according to the second embodiment. The semiconductor device is an enhancement-type field effect transistor (FET), which has a positive threshold voltage. The FET constitutes a power amplifier circuit or a low noise amplifier circuit.

A first recess 40 is formed by etching. The first recess 40 is formed at a portion between the regions where a source electrode 14 and a drain electrode 15 is to be formed. The first recess 40 is a groove formed by partly removing the cap layer 13 and the stopper layer 12.

A second recess 41 is formed in the first recess 40 by etching. The second recess 41 is a groove formed by partly removing the intermediate layer 11 and the stopper layer 10. The stopper layer 10 serves as an etching stopper layer for the second recess 41.

A compound semiconductor layer (a compound semiconductor region) 18 doped with the second conductivity-type impurity is deposited in the second recess 41, utilizing a selective regrowth technique. The compound semiconductor layer 18 is a p-type GaAs ($p^+$-GaAs) layer with a 90 nm film thickness doped with an impurity (C). The impurity concentration of the compound semiconductor layer 18 is on the order of $1 \times 10^{20}$ $cm^{-3}$. Here, the impurity concentration of the second conductivity-type semiconductor layer 18 is preferably higher than that of the n-type AlGaAs layer 7. The concentration lower than the n-type AlGaAs layer 7 is undesirable because the width of the depletion layer, which expands in the second conductivity-type semiconductor 18, becomes larger.

A gate electrode 19 of the FET is formed on the compound semiconductor layer 18. The gate electrode 19 is made of WSi, and comes into ohmic contact with the compound semiconductor layer 18. Namely, the gate electrode 19 is an ohmic electrode. A p-n junction is formed between the p-type second conductivity-type semiconductor layer 18 and the n-type AlGaAs layer 7. A voltage applied to the gate electrode 19 controls the thickness of the depletion layer expanding from the p-n junction to a channel layer side to modulate the amount of the electron accumulation in the channel layer 5, thereby performing the on/off control of the FET.

According to the structure of the present embodiment, it is also possible to suppress the electron accumulation in the two-layer structure of the InGaP layer 10 and the GaAs layer 9 and reduce the gate leakage current generated with the gate electrode 19 adjacent alongside.

Third Embodiment

Figure 5:
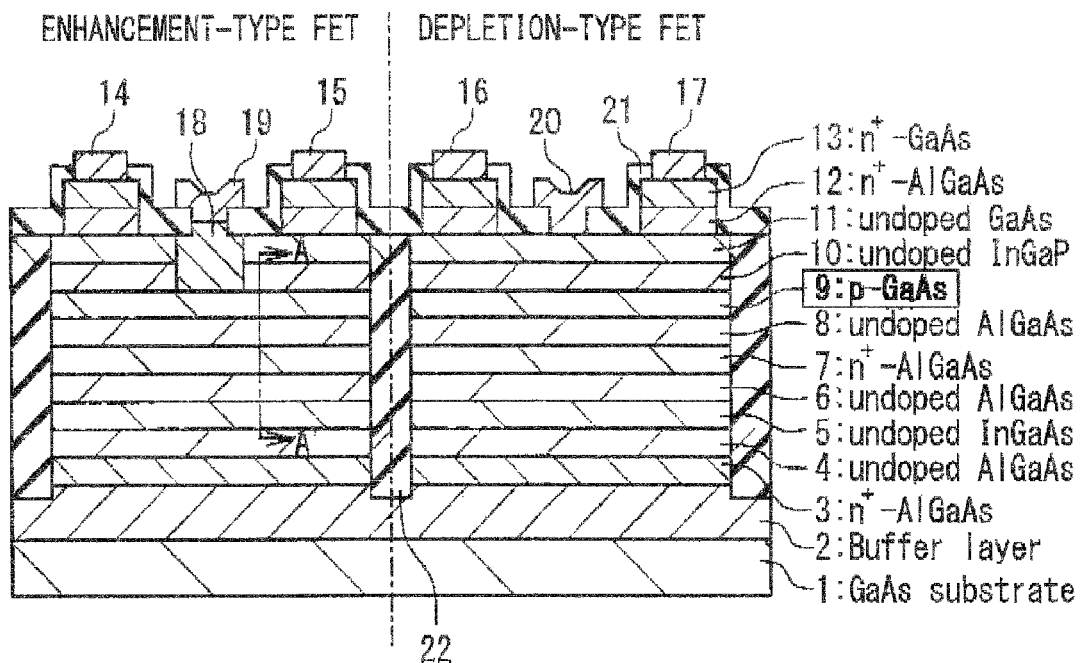
FIG. 5 is a cross sectional view of a semiconductor device according to the third embodiment.

FIG. 5 is a cross sectional view of a semiconductor device according to the third embodiment. The semiconductor device includes a depletion-type field effect transistor of the first embodiment, and an enhancement-type field effect transistor of the second embodiment, both formed on the same single substrate. Two types of transistors prepared on the same single substrate make it possible to form a power amplifier circuit and a low noise amplifier circuit including the enhancement-type field effect transistor, and a switch circuit including the depletion-type field effect transistor on the same single pellet, thereby enabling an area of the pellet to be reduced.

Fourth Embodiment

Figure 6A:
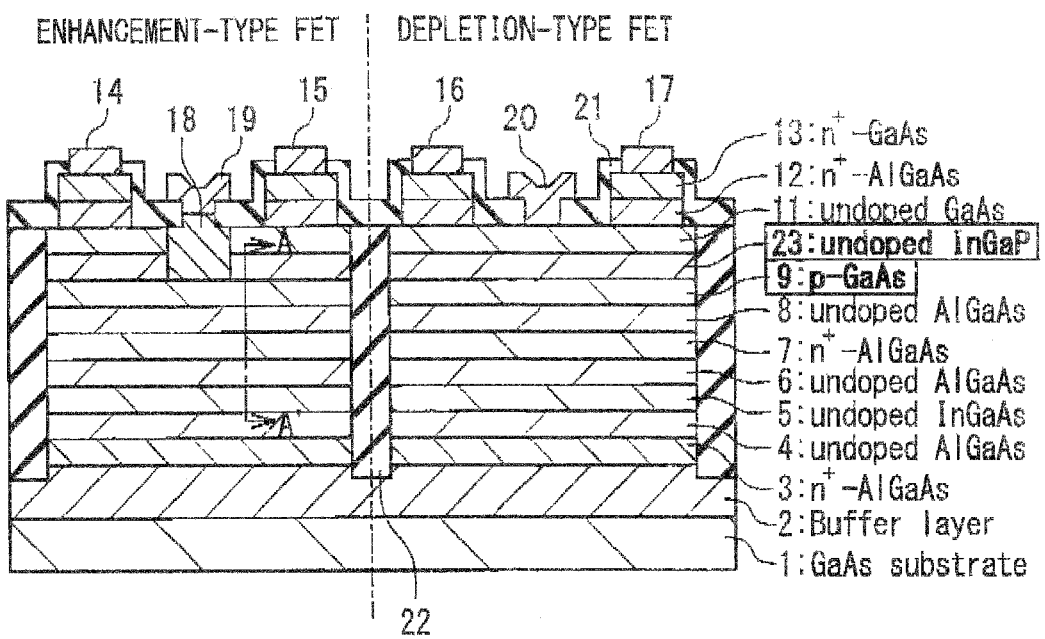
FIG. 6A is a cross sectional view of a semiconductor device according to the fourth embodiment.

In the fourth embodiment shown in FIG. 6A, the InGaP layer 10 formed on the p-GaAs layer 9 in the first embodiment is replaced with a disorder type InGaP layer 23.

Figure 6B:
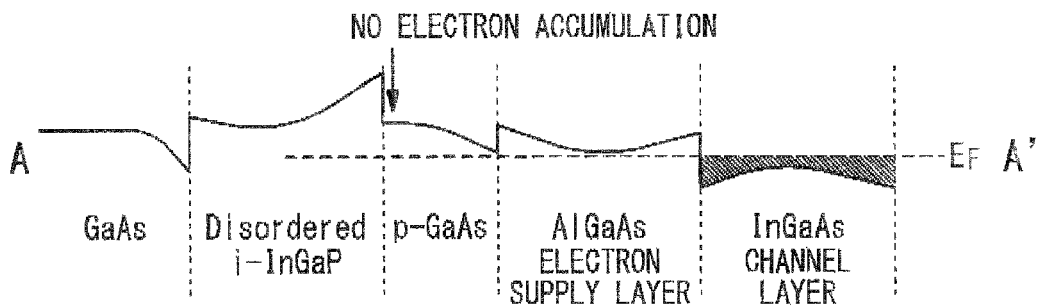
FIG. 6B is an explanatory diagram of the semiconductor device according to the fourth embodiment.

The present embodiment will be described using an energy band diagram in FIG. 6B. In the present embodiment, a p-type impurity is doped to make an underlying GaAs layer as a p-type semiconductor. As a result, a conduction band of GaAs is raised higher than the Fermi level. Electron accumulation is thus suppressed and a gate leakage current is reduced.

Fifth Embodiment

Figure 7A:
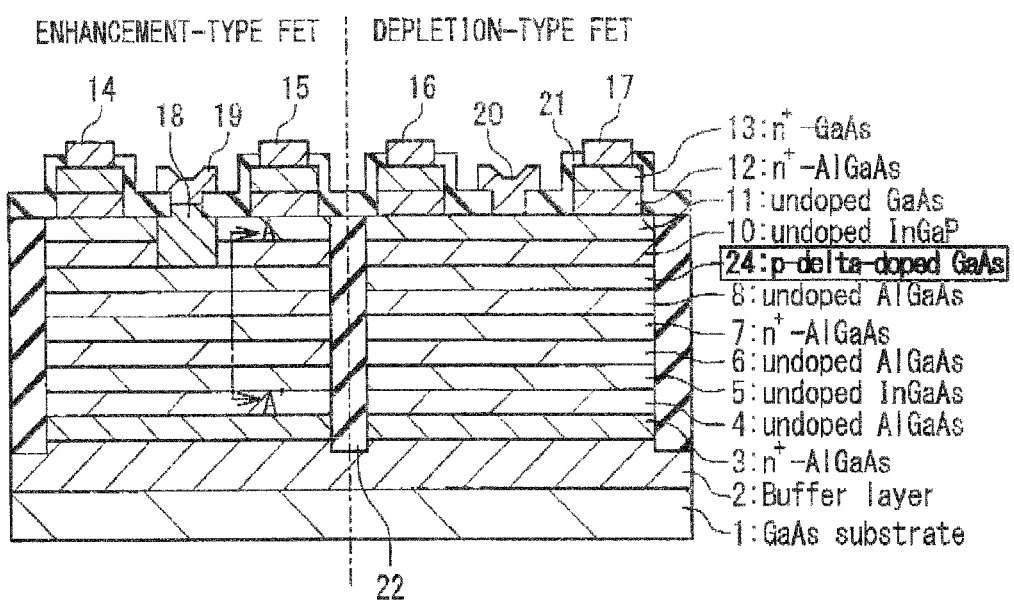
FIG. 7A is a cross sectional view of a semiconductor device according to the fifth embodiment.

The p-GaAs layer 9 in the fourth embodiment is doped evenly with a p-type impurity. In a fifth embodiment shown in FIG. 7A, the corresponding GaAs layer 24 is delta doped with a p-type impurity on the side of the InGaP layer 10.

Figure 7B:
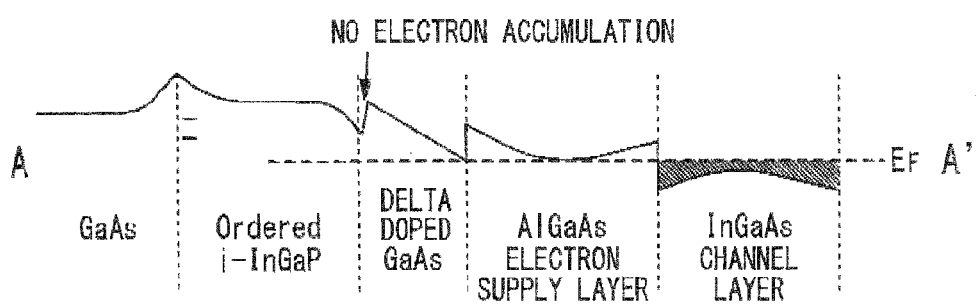
FIG. 7B is an explanatory diagram of a semiconductor device according to the fifth embodiment.
Figure 7C:
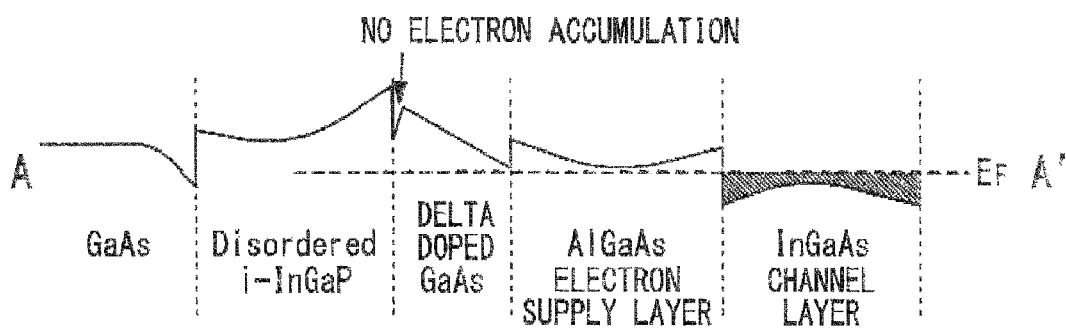
FIG. 7C is an explanatory diagram of a semiconductor device according to the fifth embodiment.

The present embodiment will be described using an energy band diagram in FIG. 7B. By the delta doping, it is possible to raise the conduction band of the GaAs layer 24 only at the proximity of the charge accumulation layer. An electron accumulation thus is suppressed and a gate leakage current is reduced. A sheet carrier concentration at the time of doping is preferably at the same level as a sheet concentration when the charge accumulation layer is formed, i.e., $10^{12}$ cm$^{-2}$. FIG. 7C shows a case where the InGaP layer is a disorder type.

Sixth Embodiment

Figure 8:
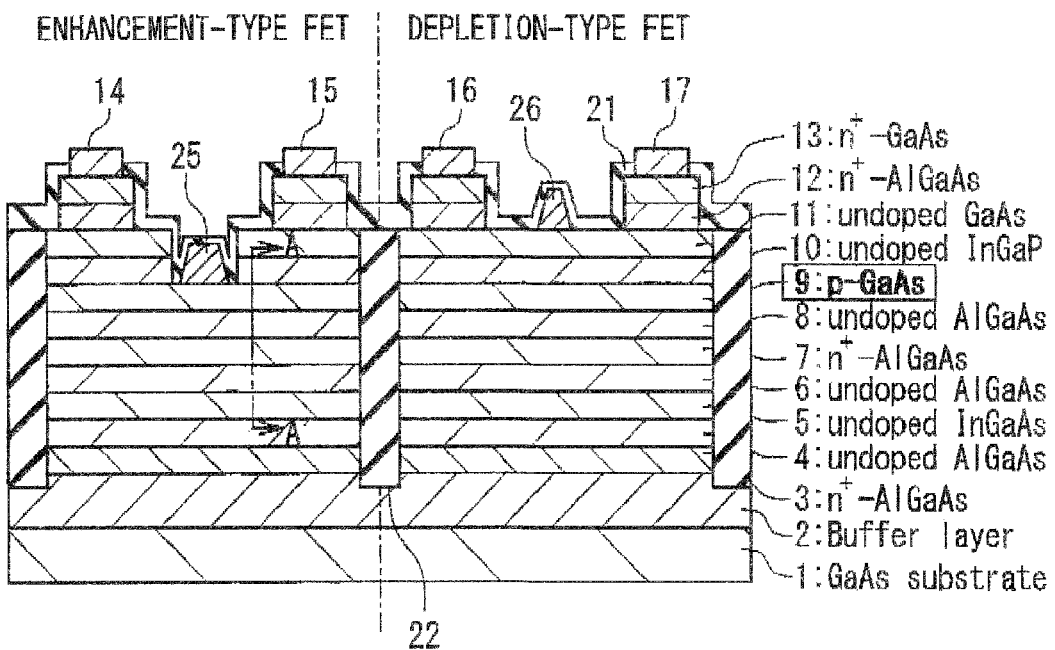
FIG. 8 is a cross sectional view of a semiconductor device according to the sixth embodiment.

In the sixth embodiment shown in FIG. 8, an embedded-type gate in any one of the first, second, third, fourth, or fifth embodiment are made as a gate electrode 25 of an enhancement-type FET formed by the liftoff, and a gate electrode 26 of a depletion-type FET formed by the liftoff. Even in the case of the liftoff gate, it is possible to suppress the electron accumulation and reduces a gate leakage current by performing the p-type doping to the GaAs layer 9.

Seventh Embodiment

Figure 9:
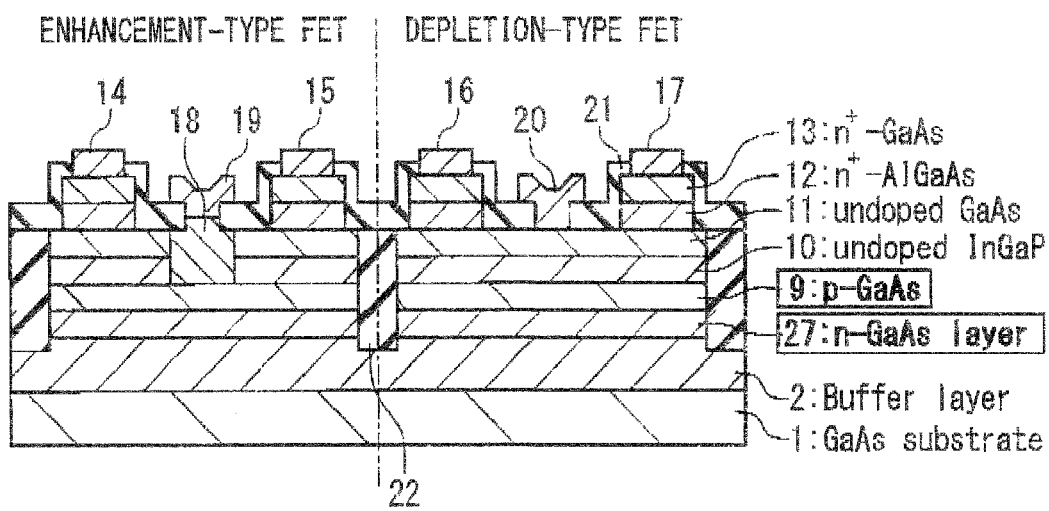
FIG. 9 is a cross sectional view of a semiconductor device according to the seventh embodiment.

FIG. 9 shows a structure of the seventh embodiment shown in which a channel in any one of the first, second, third, fourth, fifth or sixth embodiment is made as an n-GaAs layer 27. Even in the present embodiment, the GaAs layer 9 subjected to the p-type doping suppresses the electron accumulation, thereby reducing a gate leakage current.

Eighth Embodiment

Figure 10:
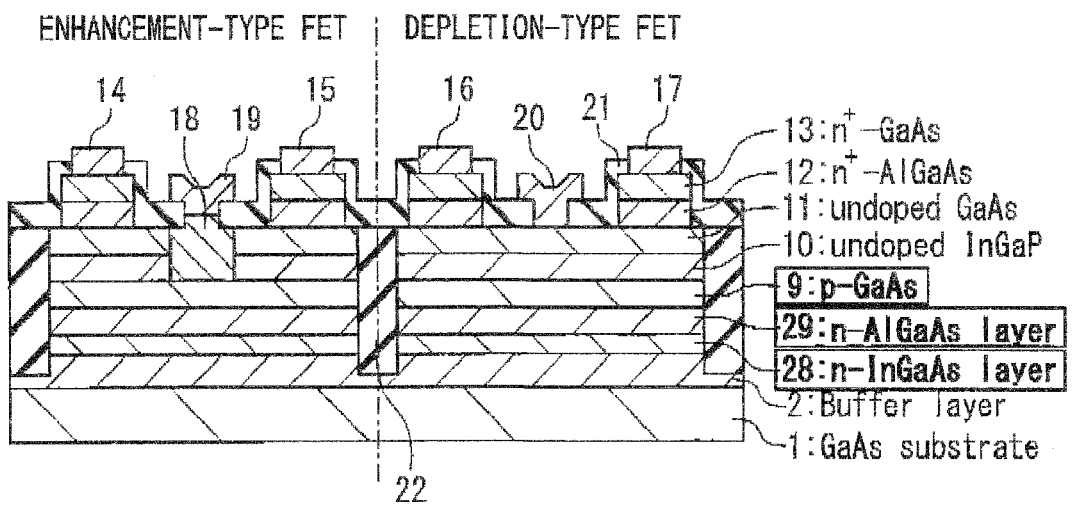
FIG. 10 is a cross sectional view of a semiconductor device according to the eighth embodiment.

In the eighth embodiment shown in FIG. 10, a channel layer in any one of the first, second, third, fourth, fifth, sixth or seventh embodiment is made as an n-InGaAs layer 28, and an electron supply layer is made as an n-AlGaAs layer 29. Even in the present embodiment, the GaAs layer 9 subjected to the p-type doping suppresses the electron accumulation, thereby reducing a gate leakage current.

Ninth Embodiment

Figure 11:
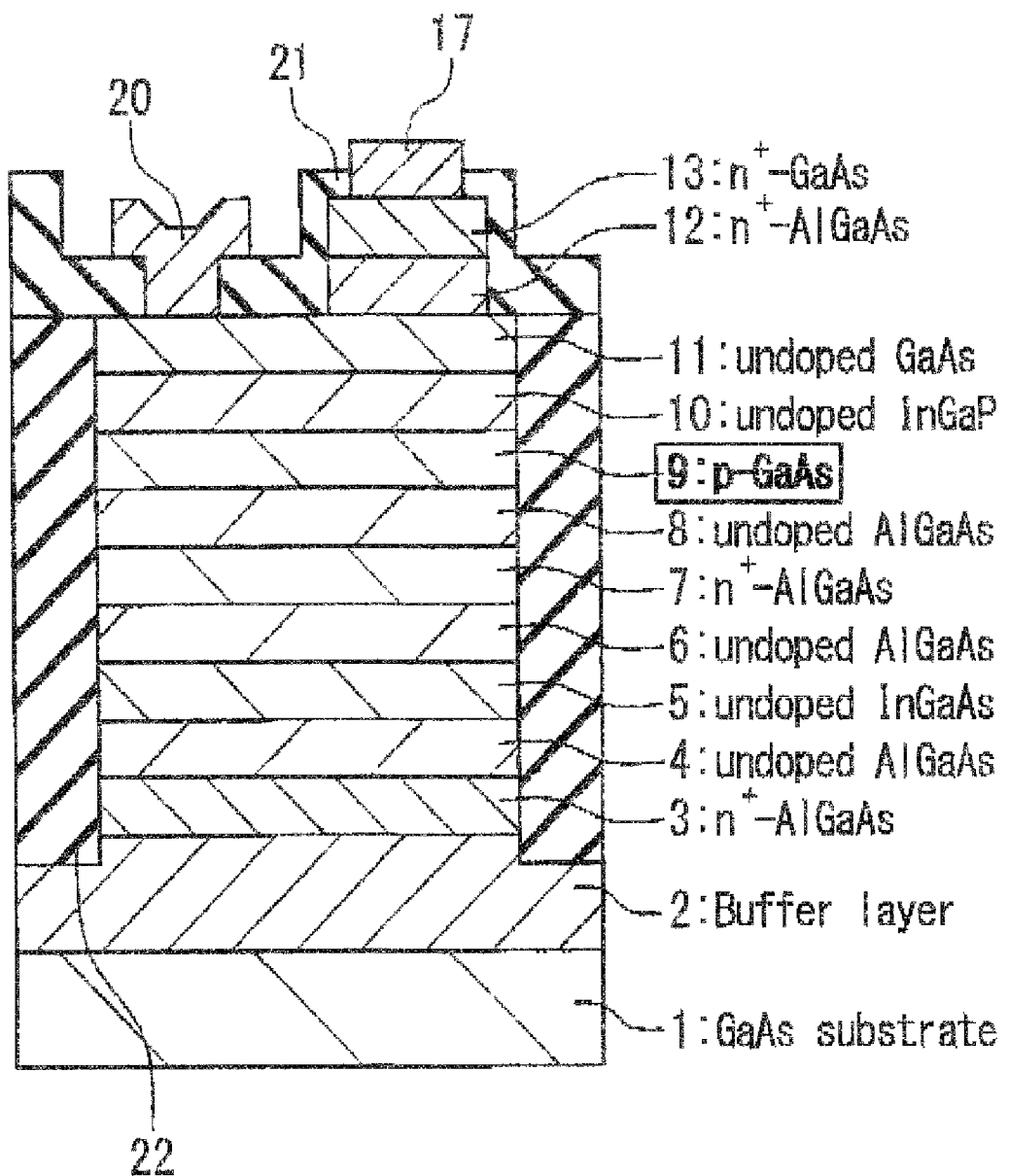
FIG. 11 is a cross sectional view of a semiconductor device according to the ninth embodiment.

FIG. 11 shows a structure of the ninth embodiment in which a field-effect transistor in any one of the first, second, third, fourth, fifth, sixth or seventh embodiment is replaced with a diode element. Even in the present embodiment, the GaAs layer 9 subjected to the p-type doping suppresses the electron accumulation, thereby reducing a gate leakage current.

As described above, in a semiconductor element having the stacked structure of the InGaP layer and the GaAs layer contacting under or alongside the gate electrode, by doping the GaAs layer with a p-type dopant, it is possible to suppress the formation of a charge accumulation layer on the interface between the InGaP layer and the GaAs layer, thereby reducing a gate leakage current.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor device comprising:
   a channel layer configured to flow a current;
   a gate electrode formed to control the current; and
   a two-layer structure in which an InGaP layer and a p-type GaAs layer being doped to be a p-type are in contact with one another, said two-layer structure being arranged on a same side of the channel layer as the gate electrode such that the p-type GaAs layer is between the channel layer and the InGaP layer.

2. The semiconductor device according to claim 1, wherein the two-layer structure is arranged between the channel layer and the gate electrode.

3. The semiconductor device according to claim 1, wherein the gate electrode extends into a recess formed in a part of the two-layer structure.

4. A semiconductor device in which plural kinds of semiconductor devices are stacked on a single substrate,
   wherein a first kind semiconductor device among the plural kinds of semiconductor devices is the semiconductor device according to claim 1 and the two-layer structure is formed between the channel layer and the gate electrode, and
   a second kind semiconductor device among the plural kinds of semiconductor devices is a semiconductor device having another gate electrode extending into a recess formed in a part of the two-layer structure.

5. The semiconductor device according to claim 4, wherein the first kind semiconductor device is a depletion type field effect transistor, and
   the second kind semiconductor device is an enhancement type field effect transistor.

6. The semiconductor device according to claim 1, wherein the InGaP layer is an order type.

7. The semiconductor device according to claim 1, wherein the InGaP layer is a disorder type.

8. The semiconductor device according to claim 1, wherein the p-type GaAs layer is p-type doped evenly.

9. The semiconductor device according to claim 1, wherein the p-type GaAs layer is p-type delta doped.

10. The semiconductor device according to claim 4, wherein at least one of the gate electrode and the other gate electrode is a p-type semiconductor gate electrode made of a p-type semiconductor.

11. The semiconductor device according to claim 10, wherein the p-type semiconductor electrode is a p-type GaAs gate electrode being a p-type doped GaAs layer.

12. The semiconductor device according to claim 4, wherein at least one of the gate electrode and the other electrode is metal.

13. The semiconductor device according to claim 1, wherein the channel layer is an undoped InGaAs layer, and the semiconductor device further comprises:
   an n-type doped AlGaAs layer on one or both sides of the channel layer and configured to be an electron supply layer.

14. The semiconductor device according to claim 13, further comprising:
   an undoped AlGaAs layer on a channel layer side of the p-type GaAs layer.

15. The semiconductor device according to claim 1, wherein the channel layer is an n-type doped GaAs layer.

16. The semiconductor device according to claim 1, wherein the channel layer is an n-type doped InGaAs layer, and
   the semiconductor device further comprises:
   an n-type doped AlGaAs layer on one or both sides of the channel layer and configured to be an electron supply layer.

17. The semiconductor device according to claim 1, wherein the semiconductor device is a diode whose anode is the gate electrode.

18. The semiconductor device according to claim 1, wherein a conduction band of the p-type doped GaAs layer is higher than the Fermi level such that electron accumulation in the p-type doped GaAs layer is suppressed.

* * * * *